(12) United States Patent
Kim et al.

(10) Patent No.: US 6,853,028 B2
(45) Date of Patent: Feb. 8, 2005

(54) NON-VOLATILE MEMORY DEVICE HAVING DUMMY PATTERN

(75) Inventors: Yong-Hee Kim, Kyunggi-do (KR);
Chul-Soon Kwon, Seoul (KR);
Jin-Woo Kim, Kyunggi-do (KR)

(73) Assignee: Samsung Electronics, Co., Ltd. (KR)

( * ) Notice: Subject to any disclaimer, the term of this patent is extended or adjusted under 35 U.S.C. 154(b) by 21 days.

(21) Appl. No.: 10/619,998

(22) Filed: Jul. 14, 2003

(65) Prior Publication Data

US 2004/0041202 A1 Mar. 4, 2004

(30) Foreign Application Priority Data

Sep. 4, 2002 (KR) ................................ 10-2002-0053118

(51) Int. Cl.[7] .............................................. H01L 29/788
(52) U.S. Cl. ...................... 257/315; 257/314; 257/288; 438/257; 438/264
(58) Field of Search .............................. 257/314, 315, 257/316, 288; 438/257, 264, 288

(56) References Cited

U.S. PATENT DOCUMENTS 6,621,117 B2 * 9/2003 Araki et al. ................. 257/314
2004/0027861 A1 * 2/2004 Ryu et al. ............... 365/185.33

* cited by examiner

Primary Examiner—Richard Elms
Assistant Examiner—Brad Smith
(74) Attorney, Agent, or Firm—F. Chau & Associates, LLC

(57) ABSTRACT

A non-volatile memory device includes a cell region and a peripheral circuit region at the semiconductor substrate. A plurality active regions are disposed in the cell region in parallel with each other. A plurality of cell line patterns cross over the active regions in parallel. A couple of tunnel insulating layers and the floating gate electrodes are disposed between the cell line patterns and the active regions. A dummy region is interposed between the cell region and the peripheral circuit region where at least one dummy line pattern is disposed in the dummy region.

14 Claims, 8 Drawing Sheets

NON-VOLATILE MEMORY DEVICE HAVING DUMMY PATTERN

FIELD OF THE INVENTION

The present invention generally relates to a non-volatile memory device and, more specifically, to a non-volatile memory device including a dummy pattern.

BACKGROUND OF THE INVENTION

Semiconductor memory devices comprise volatile and non-volatile types. A volatile memory device loses data stored in its memory cells when power is cut off. A non-volatile memory device does not lose data stored in the memory cells when power is cut off. DRAM and SRAM are volatile memory devices. A mask read only memory (Mask-ROM), an erasable and programmable ROM (EPROM), an electrically erasable and programmable ROM (EEPROM), flash memories and the like are non-volatile memory devices. Most non-volatile memories can be erased and programmed.

The EEPROM can be either a flash memory device in a stack gate structure or a flash memory device in a split gate structure. The stack gate structure device comprises a floating gate and a control gate which are sequentially stacked. The floating gate stores electronic charges and the control gate controls switching operations. On the other hand, the split gate structure device includes a control gate which is disposed adjacent to one side of the floating gate.

FIGS. 1–4 are cross-section views showing steps of forming a flash memory device in a conventional split gate structure. Reference numbers "a" and "b" of the drawings represent a cell region and a peripheral circuit region, respectively.

Referring to FIG. 1, a tunnel insulating layer 2, a floating gate conductive layer 3 and a mold layer 4 are sequentially formed on an entire surface of a semiconductor substrate 1. The tunnel insulating layer 2 is formed of a thermal oxide layer and the floating gate conductive layer 3 is formed of a doped polysilicon layer. The mold layer 4 is formed of a silicon nitride layer. The mold layer 4 is patterned to form a groove 5 exposing a predetermined region of the floating gate conductive layer 3 of the cell region "a". The floating gate conductive layer 3 exposed by the groove 5 is recessed to a predetermined thickness. Preliminary spacers 6 are formed on both sidewalls of the groove 5. The preliminary spacers 6 are formed of a silicon oxide layer. Using the preliminary spacers 6 and the mold layer 4 as an etching mask, the floating gate conductive layer 3 and the tunnel insulating layer 2 are successively etched to expose a predetermined region of the semiconductor substrate 1. Impurity ions are implanted into the exposed semiconductor substrate 1 to form a source region 7. A liner oxide layer (not shown) is formed on an entire surface of the semiconductor substrate 1 including the source region 7. The liner oxide layer is etched back until the mold layer 4 is exposed, thereby forming liner spacers 8 on the preliminary spacers 6. Spacers 9 comprise the preliminary spacers 6 and the liner spacers 8. A source conductive layer 10 is formed on an entire surface of a semiconductor substrate 1 including the spacers 9, thereby filling the groove 5. The source conductive layer 10 is formed of a doped polysilicon layer.

Referring to FIG. 2, the source conductive layer 10 is planarized until the mold layer 4 is exposed. Thus a source line 10a is formed in the groove 5. The exposed mold layer 4 and the floating gate conductive layer 3 under the mold layer 4 and the tunnel insulating layer 2 are successively etched to expose the semiconductor substrate 1. Thus, a floating gate electrode 3a is formed in the spacer 9. The semiconductor substrate 1 is exposed at the peripheral circuit region "b".

A control gate insulating layer 21, a control gate conductive layer 22 and an oxidation barrier layer 23 are sequentially formed on an entire surface of the semiconductor substrate 1 including the floating gate electrode 3a. The control gate insulating layer 21 is made of a silicon oxide layer and the control gate conductive layer 22 is formed of a doped polysilicon layer. The oxidation barrier layer 23 is formed of a silicon nitride layer.

Referring to FIGS. 3 and 4, the oxidation barrier layer 23, the control gate conductive layer 22 and the control gate insulating layer 21 are planarized by a chemical mechanical polishing process, thereby exposing a top surface of the source line 10a. Therefore, an oxidation barrier pattern 23a is formed where a step coverage is low in the cell region "a". The control gate conductive layer 22 that is located on the spacer 9 and the source line 10a is etched. Thus, a portion of the control gate conductive layer 22 is exposed between the spacer 9 and the oxidation barrier pattern 23a.

An oxidation barrier pattern 23a having an identical step coverage with the oxidation barrier pattern 23a of the cell region "a" is formed at the peripheral circuit region "b".

Hard mask layers 25 are formed on top surfaces of the control gate conductive layer 22 and the source line 10a that are exposed in the cell region "a". Each of the hard mask layer 25 is formed of a thermal oxide layer.

Using the hard mask layer 25 as a mask, the oxidation barrier pattern 23a is etched to expose the control gate conductive layer 22 under the oxidation barrier pattern 23a. The control gate conductive layer 22 is anisotropically etched to form a control gate line 22a in the cell region "a" using the hard mask layer 25 of the cell region "a" as a mask. To prevent from being etched, the control gate conductive layer 22 of the peripheral circuit region "b" may be covered by the photo sensitive layer.

As explained above, a dishing phenomenon may occur during the chemical mechanical polishing process to expose a portion of the control gate conductive layer 22. The dishing results from a step coverage or a pattern density of the cell region "a" and the peripheral circuit region "b". A reference number k represents an etching surface that may be etched by dishing. Because of dishing, the shape of the furthest peripheral cell m of the cell region "a" may be degraded. In addition, the control gate conductive layer 22, which extends from the furthest peripheral cell m to the peripheral circuit region "b" may be exposed. Therefore, the hard mask layer 25 may be formed on the exposed control gate conductive layer 22b. As a result, when the control gate line 22a is formed using the hardmask layer 25 as a mask, the control gate line 22a of the furthest peripheral cell m may not be formed.

A need therefore exists for a non-volatile memory device with minimal degradation of a furthest peripheral cell of a cell region due to dishing.

SUMMARY OF THE INVENTION

According to an embodiment of the present invention, the non-volatile memory device comprises a semiconductor substrate including a cell region and a peripheral circuit region. A plurality of active regions are disposed in the cell region in parallel. A plurality of cell line patterns cross over the active regions in parallel. A couple of tunnel insulating layers and floating gate electrodes are interposed between the cell line pattern and the active region. A couple of control gate lines are disposed on both sidewalls of the cell line. A dummy region is interposed between the cell region and the peripheral circuit region. At least one dummy line pattern parallel to the cell line pattern is disposed in the dummy region. Each of the cell line patterns comprises a plane sidewall and a curved sidewall, and a couple of spacer lines are disposed for curved sidewalls to face each other. The source line is interposed between the couple of spacer lines and electrically connected to the active region between the couple of spacer lines.

The dummy line pattern is preferably shaped like a loop of surrounding the cell region. The dummy line pattern includes a couple of dummy spacer lines and a dummy source line. The dummy spacer lines are spaced apart from each other and comprise a curved sidewall and a plane sidewall. The dummy source line is interposed between the couple of dummy spacer lines. The couple of dummy spacer lines are disposed for the curved sidewalls thereof to face each other.

A device isolating layer is preferably disposed in the semiconductor substrate under the dummy line pattern. A dummy floating gate electrode may be interposed between the device isolating layer and the dummy spacer line. A dummy control gate line may be disposed on the plane sidewall of the dummy spacer line.

The dummy line pattern and the furthest peripheral cell line pattern of the cell region are preferably spaced apart by a predetermined distance. The predetermined distance is preferably identical with a distance between the cell line patterns.

DETAILED DESCRIPTION OF PREFERRED EMBODIMENTS

Figure 1:
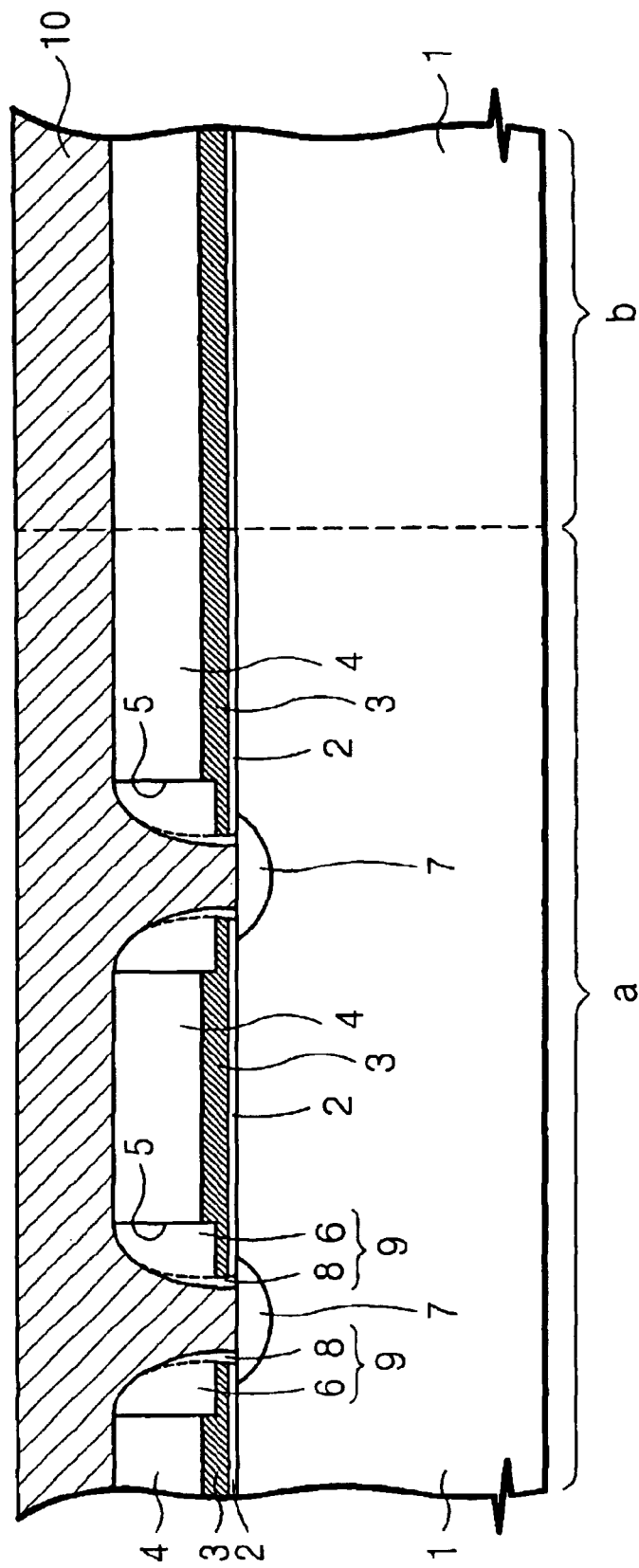
FIGS. 1–4 are cross-sectional views illustrating steps of forming a flash memory device in a conventional split gate structure.
Figure 2:
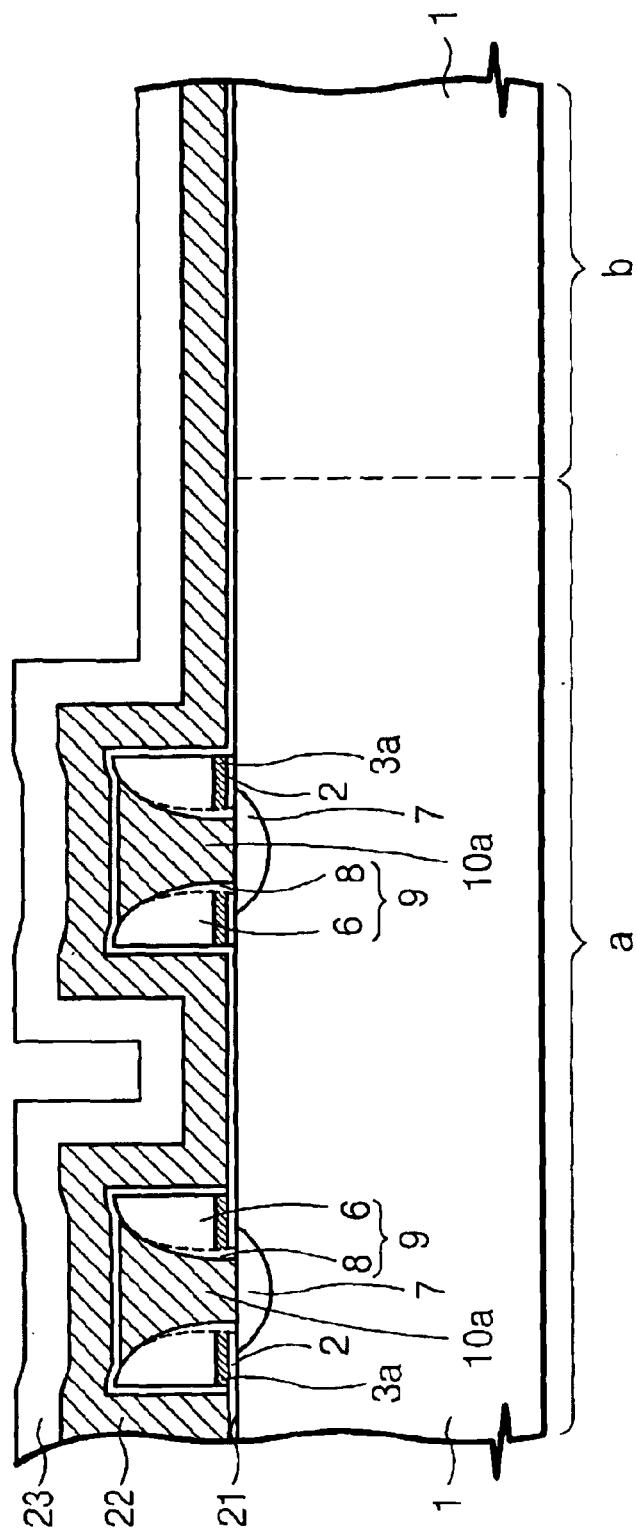
Figure 3:
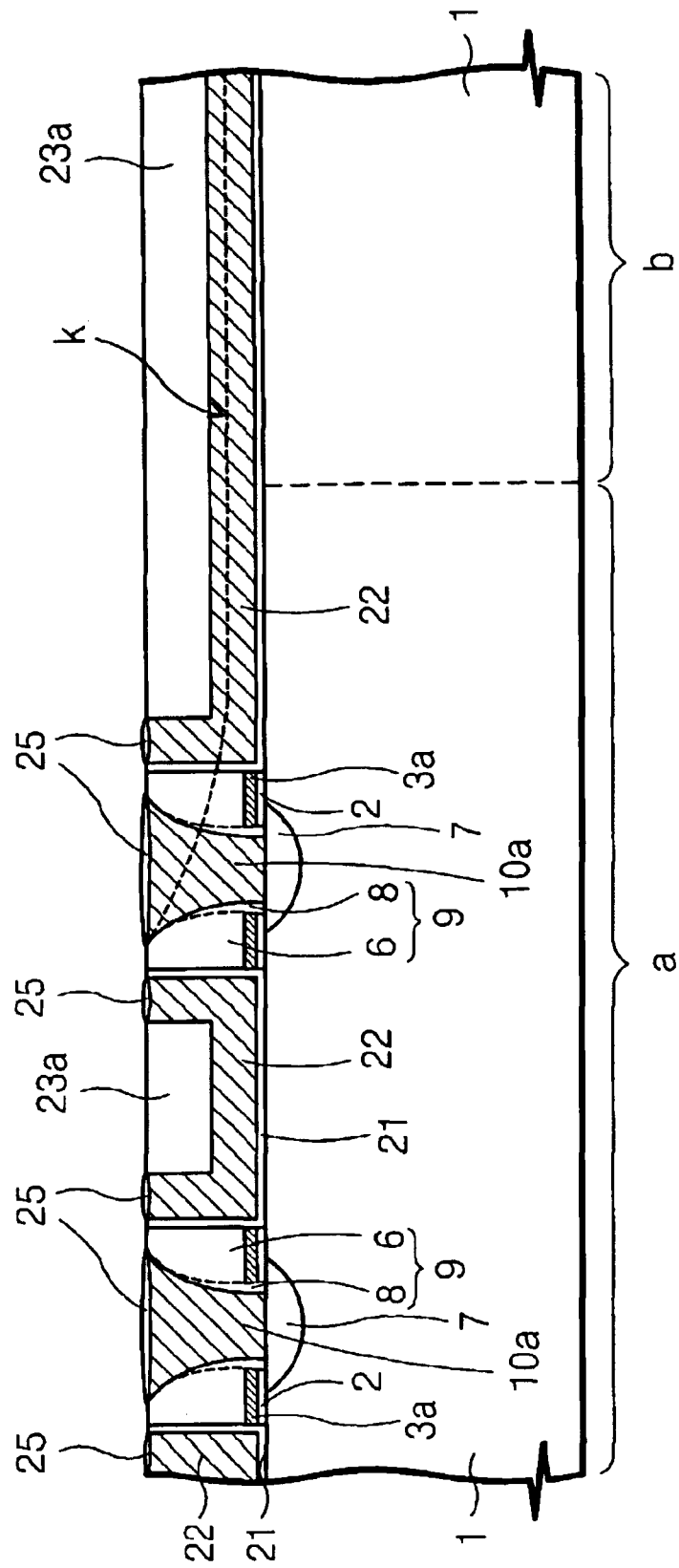
Figure 4:
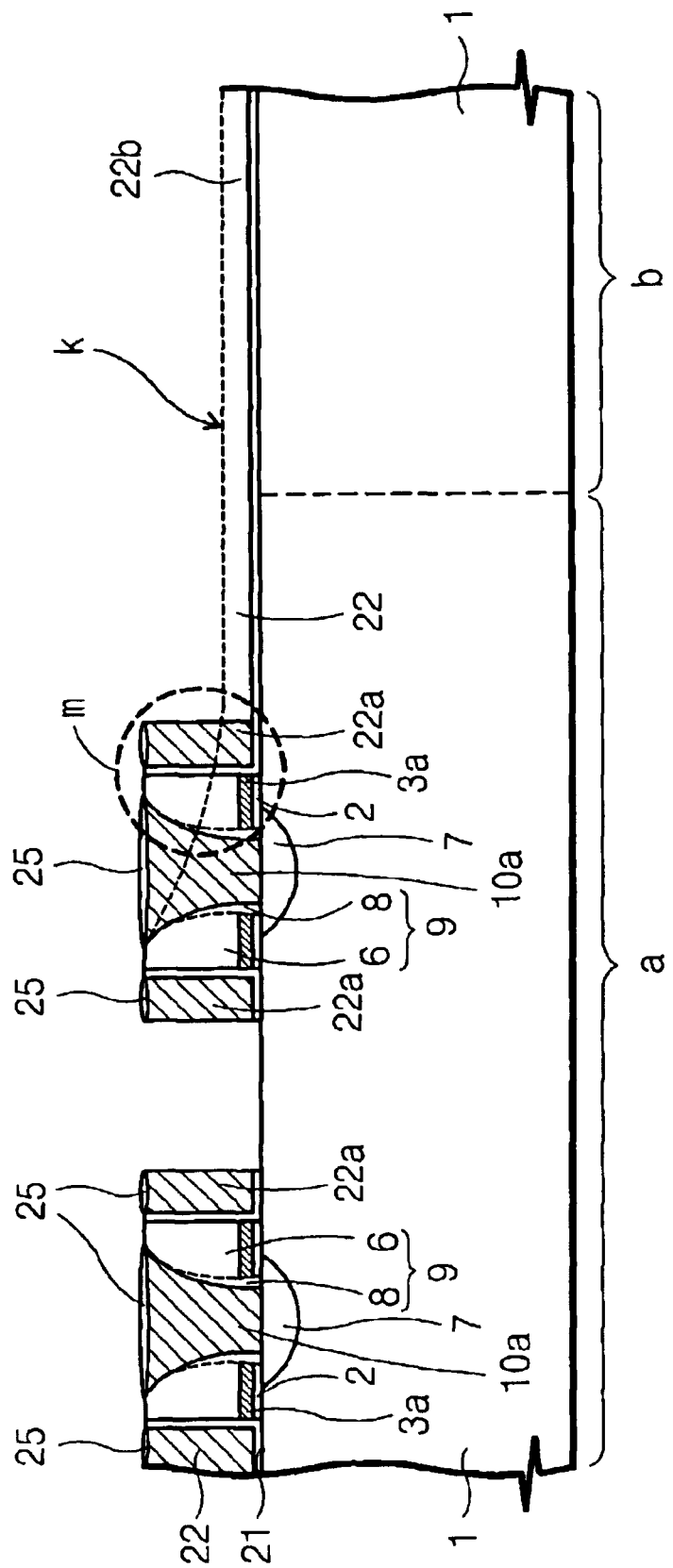

The present invention will be described more fully hereinafter with reference to the accompanying drawings, in which preferred embodiments of the invention are shown. This invention, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or a substrate, it can be directly on the other layer or the substrate, or intervening layers may also be present thereof. Like numbers refer to like elements throughout the specification.

Figure 5:
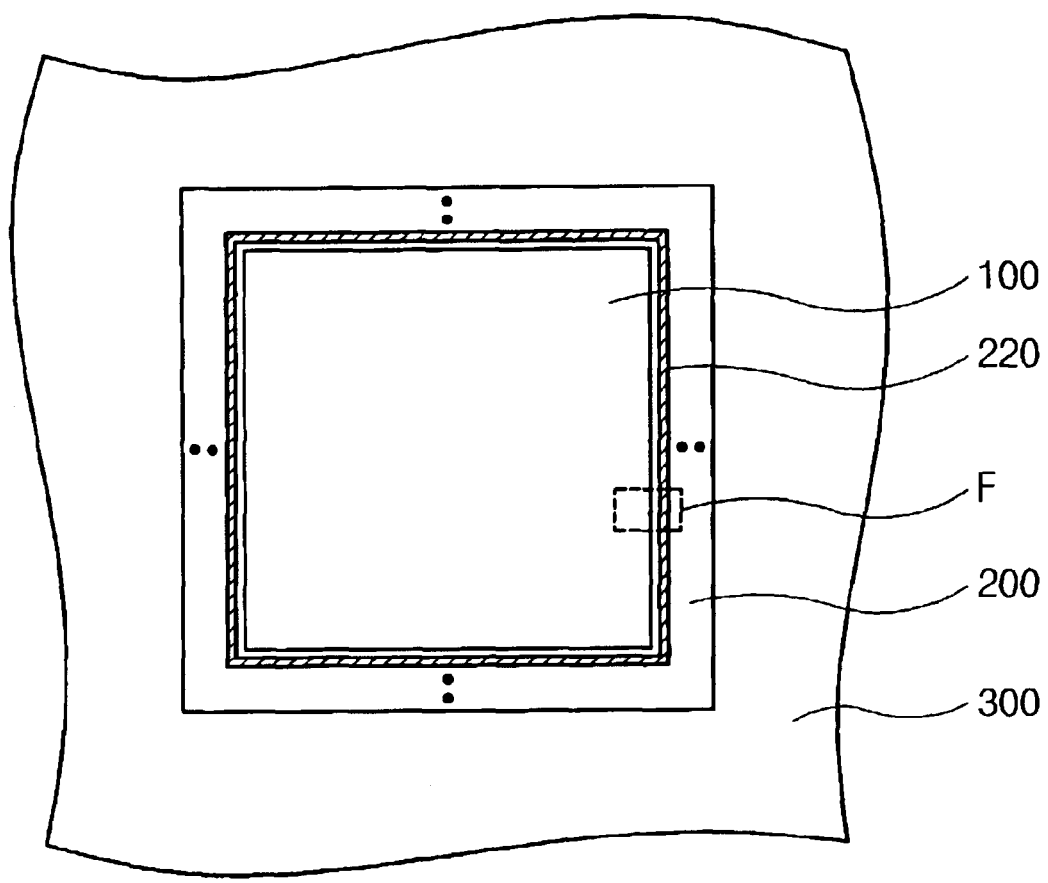
FIG. 5 is a plane view illustrating a non-volatile memory device in accordance with the present invention.
Figure 6:
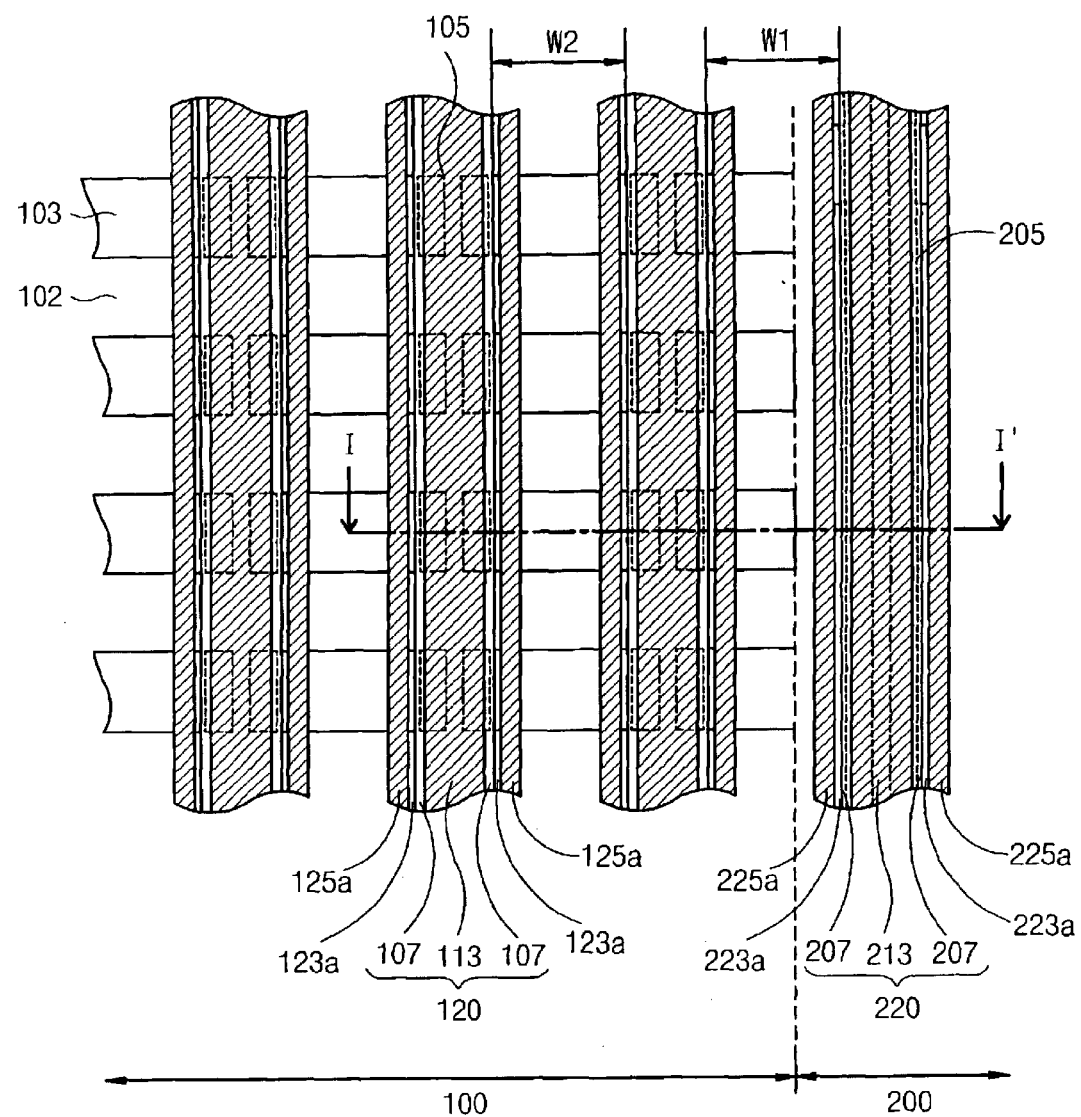
FIG. 6 is an expanded view of portion "F" of FIG. 5.
Figure 7:
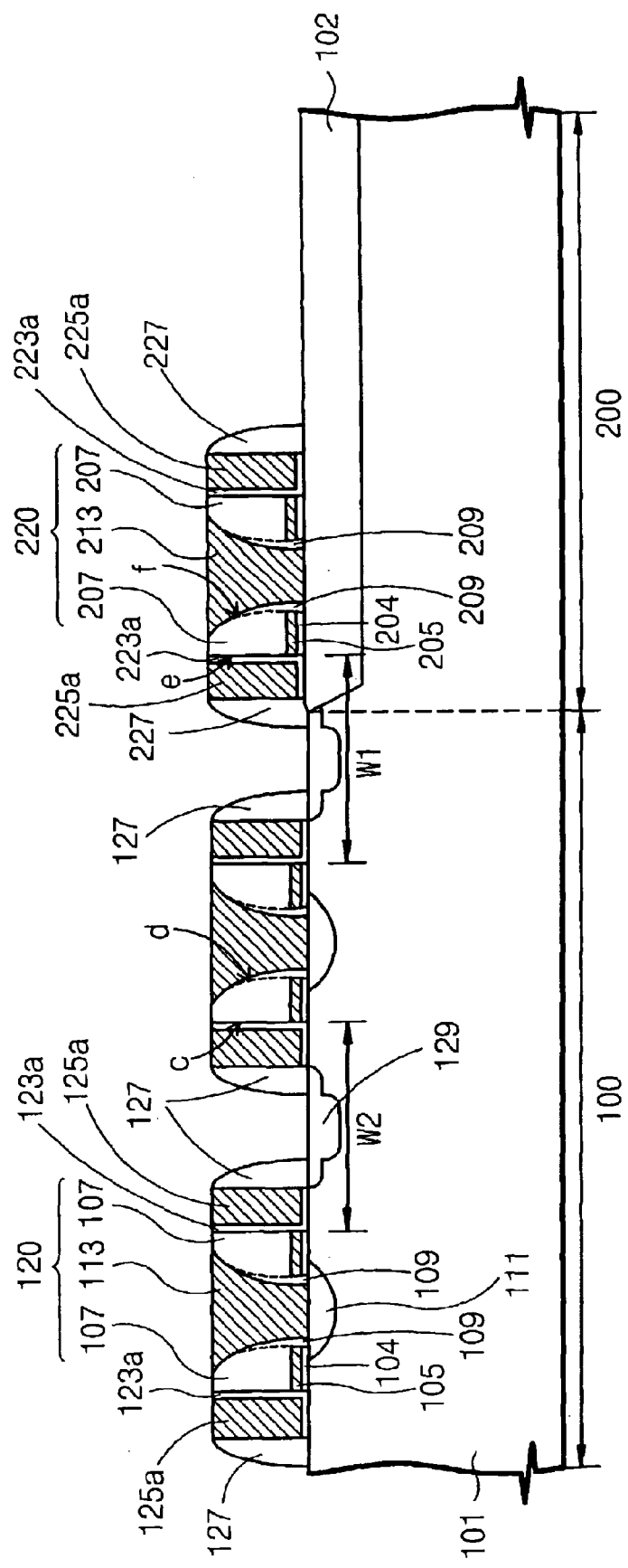
FIG. 7 is a cross-sectional view illustrating a non-volatile memory device, taken along a line I–I' of FIG. 6.

FIG. 5 is a plane view showing a non-volatile memory device in accordance with a preferred embodiment of the present invention. FIG. 6 is an expanded view of portion "F" of FIG. 5. FIG. 7 is a plane view showing a non-volatile memory device according to a preferred embodiment of the present invention, taken along a line I–I' of FIG. 6.

Referring to FIGS. 5, 6 and 7, a non-volatile memory device according to a preferred embodiment of the present invention includes a cell region 100 and a peripheral circuit region 300 on a semiconductor substrate 101. A dummy region 200 is interposed between the cell region 100 and the peripheral circuit region 300.

A plurality of active regions 103 are preferably disposed in parallel with each other at a predetermined region of the cell region 100. The active regions 103 are defined by a device isolating layer 102. A plurality of cell line patterns 120 are disposed in parallel to cross over the active regions 103. The cell line pattern 120 comprises a couple of spacer lines and a source line 113. The couple of spacer lines 107 are spaced apart to cross over the active regions 103. The source line 113 is interposed between the couple of spacer lines 107. Each of the spacer lines 107 includes a plane sidewall "c" and a curved sidewall "d". The couple of spacer lines 107 are disposed for the curved sidewall thereof to face each other. The source lines 113 are electrically connected with the active region 103 between the couple of spacer lines 107. A source region 111 is disposed in the active region where the source lines 113 are electrically connected to the source region. A tunnel insulating layer 104 and a floating gate electrode 105 are sequentially interposed between the spacer line 107 and the active region 103. A liner spacer 109 is preferably interposed between the source line 113, each of the spacer line 107, the tunnel insulating layer 104, and the floating gate electrode 105. The liner spacer 109 electrically insulates the source line 113 and the floating gate electrode 105.

The device isolating layer 102 may be made of a trench isolating layer, and the spacer line 107 may be made of a silicon oxide layer. The source line 113 is preferably made of a doped polysilicon layer. Impurities of the doped polysilicon layer is the same type as those of the source region 111. For example, when the source region 111 is doped with n-type impurities, the source line 113 is preferably doped with n-type impurities. The liner spacer 109 may be formed of an insulating layer e.g., a silicon oxide layer. The tunnel insulating layer 104 may be formed of a thermal oxide layer. The floating gate electrode 105 may be made of a doped polysilicon layer.

Control gate lines 125a are disposed on both sidewalls of the cell line pattern 120. Preferably, the control gate line 125a is disposed on the plane sidewall "c" of the spacer line 107. A control gate insulating layer 123a is interposed between the control gate line 125a, each of the spacer line 107, the tunnel insulating layer 104, and the floating gate electrode 105. The control gate insulating layer 123a is also interposed between the active regions 103 at one side of the spacer line 107 and the control gate line 125a. The control gate line 125a may be made of a doped polysilicon layer. The control gate insulating layer 123a may be formed of a CVD (chemical mechanical deposition) silicon oxide layer. A gate spacer 127 may be disposed at one side of the control gate line 125a. Preferably, the gate spacer 127 is disposed at one side of the control gate line 125. At the other side of the gate line 125, the control gate insulating layer 123a and the spacer line 107 are sequentially disposed. A drain region 129 is disposed in the active region 103 at one side of the gate spacer 127. As a result, a unit cell of a non-volatile memory device comprises the tunnel insulating layer 104, the floating gate electrode 105, the source region 111, the drain region 129, the control gate insulating layer 123a, and the control gate line 125a.

At least one dummy line pattern 220 is disposed in a dummy region 200. A part of the dummy line pattern 220 is in parallel with the cell line pattern 120. The peripheral circuit region 300 may be formed to surround the cell region 100. In this case, the dummy region 200 preferably surrounds the cell region 100, and the dummy line pattern 220 is preferably shaped like a loop and surrounds the cell region 100.

The dummy line pattern 220 and the cell line pattern 120 adjacent thereto are spaced apart by a predetermined distance W1. The cell line pattern 120 adjacent to the dummy line pattern 220 is the furthest peripheral cell line pattern 120 in the cell region 100.

Preferably, a distance W1 between the dummy line pattern 220 and the furthest peripheral cell line pattern 120 is selected so as not to cause dishing, which otherwise might result from a chemical mechanical polishing (CMP) process. For example, the distance W1 is preferably identical with a distance W2 between the cell line patterns 120. Thus, degradation of the furthest peripheral cell by dishing can be reduced.

The dummy line pattern 220 is made in a line-shaped pattern having an identical height with the cell line pattern 220. Preferably, the dummy line pattern 220 comprises a couple of dummy space lines 207 each having a plane sidewall "e" and a curved sidewall "f", and a dummy source line 213. The couple of dummy spacer lines 207 are spaced apart from each other. The dummy source line 213 is interposed between the couple of dummy spacer lines 207. The couple of dummy spacer lines 207 are preferably disposed for the curved sidewalls "f" thereof to face each other. The dummy source line 213 disposed between the couple of dummy spacer lines 207 is in contact with a semiconductor substrate 101 without being electrically connected thereto. The dummy spacer line 207 and the dummy source line 213 are preferably made of identical material layers with those of the space line 107 and the source line 113, respectively. Preferably, the dummy spacer lines 207 is made of a silicon oxide layer and the dummy source line 213 is made of a doped polysilicon layer.

The device isolating layer 102 is preferably disposed on the semiconductor substrate 101 and under the dummy line pattern 220. The device isolating layer 102 may be disposed in an entire dummy region 200. A dummy tunnel insulating layer 204 and a dummy floating gate electrode 205 may be disposed between the dummy spacer line 207 and the device isolating layer 102. The dummy tunnel insulating layer 204 may be omitted. The dummy floating gate electrode 205 may be line-shaped like the dummy spacer line 207. On the contrary, the dummy floating gate electrode 205 is shaped like the floating gate electrode 105 at the cell region 100. A dummy liner spacer 209 may be interposed between the dummy source line 213 and the dummy spacer line 207 and between the dummy source line 213 and the dummy floating gate electrode 205. The dummy floating gate electrode 205 may be formed of a polysilicon layer. The dummy tunnel insulating layer 204 may be formed of a silicon oxide layer. The dummy liner spacer 209 may be made of an identical material layer with that of the dummy spacer line 207, for example, a silicon nitride layer.

Dummy control gate lines 225a may be disposed at both sides of the dummy line pattern 220. Preferably, the dummy control gate line 225a may be disposed on the plane sidewall "e" of the dummy spacer line 207. A dummy control gate insulating layer 223a may be interposed between the control gate line 225a, each of the dummy line pattern 220, and the semiconductor substrate 101 of the both sides of the dummy line pattern 220. A dummy gate spacer 227 may be disposed at one side of the control gate line 225a. The dummy control gate line 225a may be made of a dope polysilicon layer, and the dummy control gate insulating layer 223a may be formed of a CVD silicon oxide layer. As a result, the dummy line pattern 220 of the dummy region 200 are formed like a cell structure in the cell region 100.

According to the non-volatile memory device of the preferred embodiment, degradation of the furthest peripheral cells from a conventional chemical mechanical polishing (CMP) process is reduced. Steps of applying the CMP process to the non-volatile memory device of the preferred embodiment will be explained hereinafter in accordance with FIG. 8.

Figure 8:
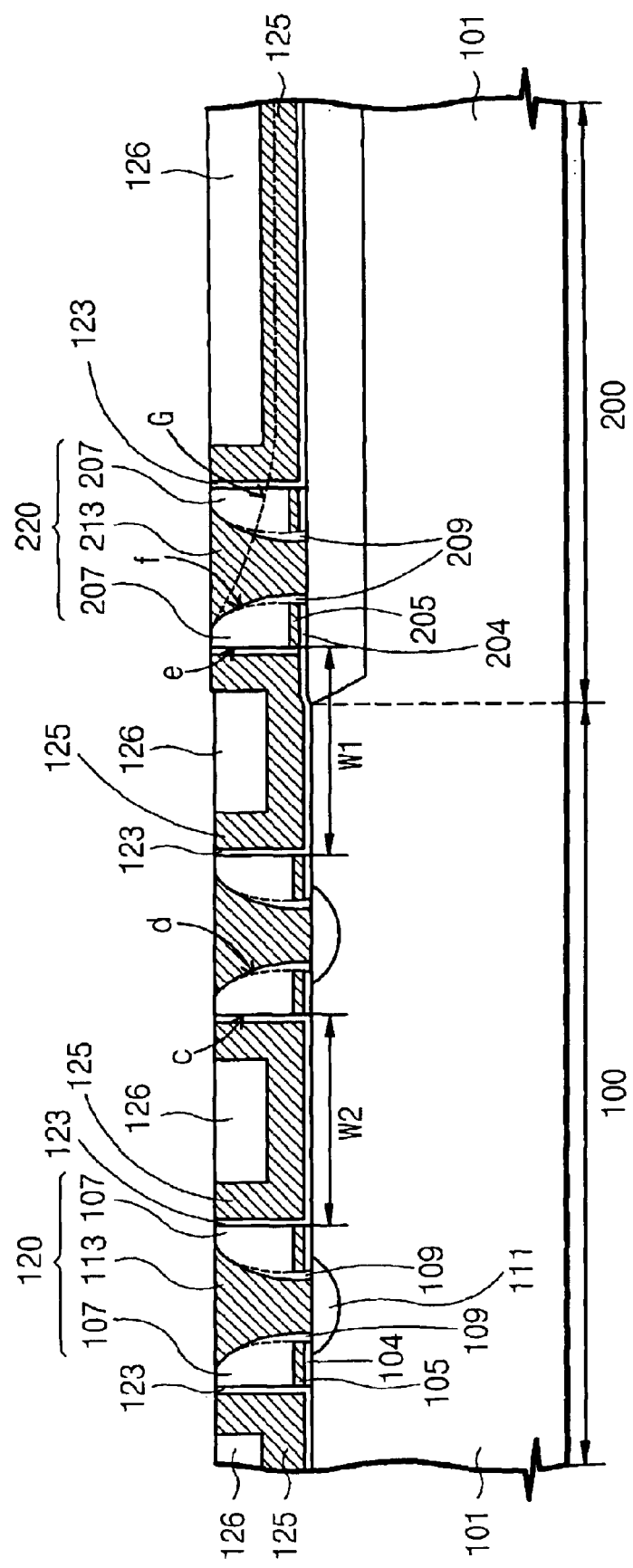
FIG. 8 is a cross-sectional view illustrating steps of applying a chemical mechanical polishing process to a non-volatile memory device in accordance with the present invention.

FIG. 8 is a cross-sectional view showing the steps of applying the CMP process to the non-volatile memory device of the preferred embodiment.

Referring to FIGS. 5 and 8, on an entire surface of the semiconductor substrate 101, a control gate insulating layer 123, a control gate conductive layer 125 and an oxidation barrier layer 126 are sequentially formed. The semiconductor substrate 101 includes a cell region 100 and a dummy region 200 including one or more dummy line pattern 220 and a peripheral circuit region 300. A plurality of cell line patterns 120 are disposed in the cell region 100. The dummy region 200 is interposed between the cell region 100 and the peripheral circuit region 300. Preferably, the control gate insulating layer 123, a control gate conductive layer 125, and the oxidation barrier layer 126 are formed on the semiconductor substrate 101 including a plurality of cell line patterns 120 and the dummy line patterns 220. A distance W1 between the dummy line pattern 220 and the cell line pattern 120 that is adjoining the dummy line pattern 220 is the same as a distance W2 between the cell line patterns 120. The oxidation barrier layer 126 is preferably formed of a material layer, e.g., a silicon nitride layer, to prevent a thermal oxide layer being formed.

The oxidation barrier layer 126 and the control gate conductive layer 125 are planarized by the chemical mechanical polishing (CMP) process until the control gate insulating layer 123 on the cell line pattern 120 is exposed. During the process, a dishing may occur due to a step coverage of the cell region 100 and the peripheral circuit region 300 or a high density of patterns. Reference number G indicates a planarized cross-section due to the dishing. The cross-section G due to the dishing is formed at the dummy line pattern 220. Although dishing occurs, the furthest peripheral cell line pattern 120 of the cell region 100 can avoid degradation because the dummy line pattern 220 is degraded instead. Thus, degradation of cells comprising the furthest peripheral cell line pattern 120 of the cell region 100 can be averted.

The non-volatile memory device of the present invention includes a dummy region between a cell region and a peripheral circuit region. Moreover, at least one dummy line pattern is disposed in the dummy region. Thus, the furthest peripheral cell of the cell region is not degraded by dishing due to a chemical mechanical polishing process.

While this invention has been particularly shown and described with reference to preferred embodiments thereof, it will be understood by those skilled in the art that various changes in form and details may be made herein without departing from the spirit and scope of the invention as defined by the appended claims.

What is claimed is:

1. A non-volatile memory device comprising:
   a semiconductor substrate including a cell region and a peripheral circuit region;
   a plurality of active regions disposed in the cell region;
   a plurality of cell line patterns crossing over the active regions;
   a tunnel insulating layer and floating gate electrodes interposed between the cell line patterns and the active regions;
   a plurality of control gate lines, each disposed adjacent to a sidewall of the cell line patterns;
   a dummy region interposed between the cell region and the peripheral circuit region; and
   at least one dummy line pattern which is disposed in the dummy region;
   wherein each of the cell line patterns comprises a couple of spacer lines and a source line;
   wherein the couple of spacer lines are comprised of a plane sidewall and a curved sidewall; and
   wherein the source line is interposed between a couple of spacer lines and electrically connected to the active region between a couple of spacer lines.

2. The non-volatile memory device according to claim 1, further comprising a liner spacer interposed between the source line and each of the spacer lines, and the floating gate electrodes, wherein the liner spacer insulates the source line and the floating gate electrodes.

3. The non-volatile memory device according to claim 1, wherein the tunnel insulating layers and the floating gate electrodes are interposed between the spacer lines and the active region, and wherein each of the control gate lines is disposed on the plane sidewall of each of the spacer lines.

4. The non-volatile memory device according to claim 1, further comprising a control gate insulating layer interposed between each of the spacer lines, the floating gate electrodes, the active region, and the control gate lines.

5. The non-volatile memory device according to claim 1, wherein the dummy region surrounds the cell region.

6. The non-volatile memory device according to claim 5, wherein the dummy line pattern forms a loop surrounding the cell region.

7. The non-volatile memory device according to claim 1, wherein the dummy line pattern comprises:
   a couple of dummy spacer lines which are disposed apart from each other in the dummy region, the dummy spacer lines comprising a curved sidewall and a plane sidewall; and
   a dummy source line interposed between the couple of dummy spacer lines, wherein the couple of dummy spacer lines are disposed for the curved sidewalls thereof to face each other.

8. The non-volatile memory device according to claim 7, wherein each of the dummy spacer lines is made of a silicon oxide layer.

9. The non-volatile memory device according to claim 7, wherein the dummy source line is made of a doped polysilicon layer.

10. The non-volatile memory device according to claim 7, further comprising a device isolating layer disposed in the semiconductor substrate and under the dummy line pattern.

11. The non-volatile memory device according to claim 7, further comprising a dummy floating gate electrode interposed between the device isolating layer and each of the dummy spacer lines.

12. The non-volatile memory device according to claim 7, further comprising:
    a dummy control gate line disposed on the plane sidewall of the dummy spacer lines; and
    a dummy control gate insulating layer interposed between each of the dummy spacer lines, the semiconductor substrate, and the dummy control gate line.

13. The non-volatile memory device according to claim 1, wherein the dummy line pattern and a furthest peripheral cell line pattern in the cell region are spaced apart by a predetermined distance which is the same as the distance between the cell line patterns.

14. A method of forming a memory device comprising:
    preparing a substrate having a cell region, a dummy region, and a peripheral circuit region;
    forming a control gate insulating layer, a control gate conductive layer and an oxidation layer on a substrate, the substrate having a cell region, a dummy region, and a peripheral circuit region, the dummy region being interposed between the cell region and the peripheral region;
    forming a plurality of cell line patterns in the cell region;
    forming a plurality of dummy line patterns in the dummy region, wherein a distance between a dummy line pattern and an adjacent cell line pattern is the same as the distance between cell line patterns;
    forming a control gate insulating layer, a control gate conductive layer and an oxidation layer on the substrate; and
    planarizing the control gate insulating layer and the oxidation layer by chemical mechanical processing.

* * * * *